(12) United States Patent
Tsai

(10) Patent No.: US 8,817,564 B2
(45) Date of Patent: Aug. 26, 2014

(54) CIRCUIT FOR SENSING MULTI-LEVEL CELL

(75) Inventor: Cheng-Hung Tsai, New Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 358 days.

(21) Appl. No.: 13/476,749

(22) Filed: May 21, 2012

(65) Prior Publication Data

US 2013/0308404 A1 Nov. 21, 2013

(51) Int. Cl.
*G11C 7/00* (2006.01)

(52) U.S. Cl.
USPC .................. 365/207; 365/189.05; 365/236

(58) Field of Classification Search
USPC ................. 365/207, 236, 189.05, 189.08
See application file for complete search history.

(56) References Cited

U.S. PATENT DOCUMENTS

| 6,069,830 | A | 5/2000 | Seo |
| 6,097,635 | A | 8/2000 | Chang |
| 6,724,686 | B2 * | 4/2004 | Ooishi et al. ............. 365/233.14 |
| 7,876,598 | B2 * | 1/2011 | Schroegmeier et al. ...... 365/148 |

* cited by examiner

*Primary Examiner* — Son Dinh
(74) *Attorney, Agent, or Firm* — WPAT, P.C.; Anthony King

(57) ABSTRACT

A circuit for sensing a multi-level cell (MLC) comprises a first switch associated with a first read bit, a second switch associated with a second read bit, a first switch control unit to control the first switch in response to a first data bit from a counter, and a second switch control unit to control the second switch in response to a second data bit from the counter.

18 Claims, 3 Drawing Sheets

CIRCUIT FOR SENSING MULTI-LEVEL CELL

BACKGROUND OF THE INVENTION

1. Field of the Invention

The present invention generally relates to a circuit for sensing a memory cell and, more particularly, to a circuit for sensing a multi-level cell.

2. Description of the Related Art

A multi-level cell (MLC) refers to one having a plurality of threshold voltages. To sense an MLC, a sensing circuit may traditionally employ an output signal from a sense amplifier to control the on/off state of a switch in order to decide whether to read data bits from a counter.

FIG. 1 is an exemplary circuit diagram of a sensing circuit 10 for sensing an MLC in prior art. Referring to FIG. 1, the sensing circuit 10 may include a sense amplifier 11, a delay unit 12, a logic "AND" gate 13, a first switch 14-1 and a second switch 14-2.

The sense amplifier 11 compares a threshold voltage of an MLC 18 with a word line voltage $V_{WL}$. If the threshold voltage is smaller than $V_{WL}$, the sense amplifier 11 provides a signal of logic 0 (zero). On the other hand, if the threshold voltage is greater than $V_{WL}$, the sense amplifier 11 provides a signal of logic 1 (one).

When the output of the sense amplifier 11 is logic 0, the AND gate 13 outputs logic 0, which turns off the switches 14-1 and 14-2. Accordingly, data bits DB[1] and DB[0] are blocked. When the output of the sense amplifier 11 is logic 1, the AND gate 13 outputs logic 1, which turns on the switches 14-1 and 14-2. The data bits DB[1] and DB[0] are then allowed to pass through buffers 17-1 and 17-2, latch units 15-1 and 15-2, and inverters 16-1 and 16-2, and are read as RB[1] and RB[0], respectively.

The sensing circuit 10 may suffer a read margin issue due to a relatively small signal width of a switch turn-on signal. Furthermore, the buffers 17-1 and 17-2 may consume a large chip area and thus are not desired.

SUMMARY OF THE INVENTION

Embodiments of the present invention may provide a circuit for sensing a multi-level cell (MLC). The circuit may comprise a first switch associated with a first read bit, a second switch associated with a second read bit, a first switch control unit to control the first switch in response to a first data bit from a counter, and a second switch control unit to control the second switch in response to a second data bit from the counter.

Some embodiments of the present invention may also provide a circuit for sensing a multi-level cell (MLC). The circuit may comprise a first switch associated with a first read bit, a first sense amplifier coupled to the first switch, and a first switch control unit to control the first switch so as to allow an output from the first sense amplifier to overwrite the first read bit in response to a first data bit from a counter.

BRIEF DESCRIPTION OF THE DRAWINGS

The invention will be described according to the appended drawings. Wherever possible, the same reference numbers will be used throughout the drawings to refer to the same or like portions. In the drawings.

PREFERRED EMBODIMENT OF THE PRESENT INVENTION

Figure 2:
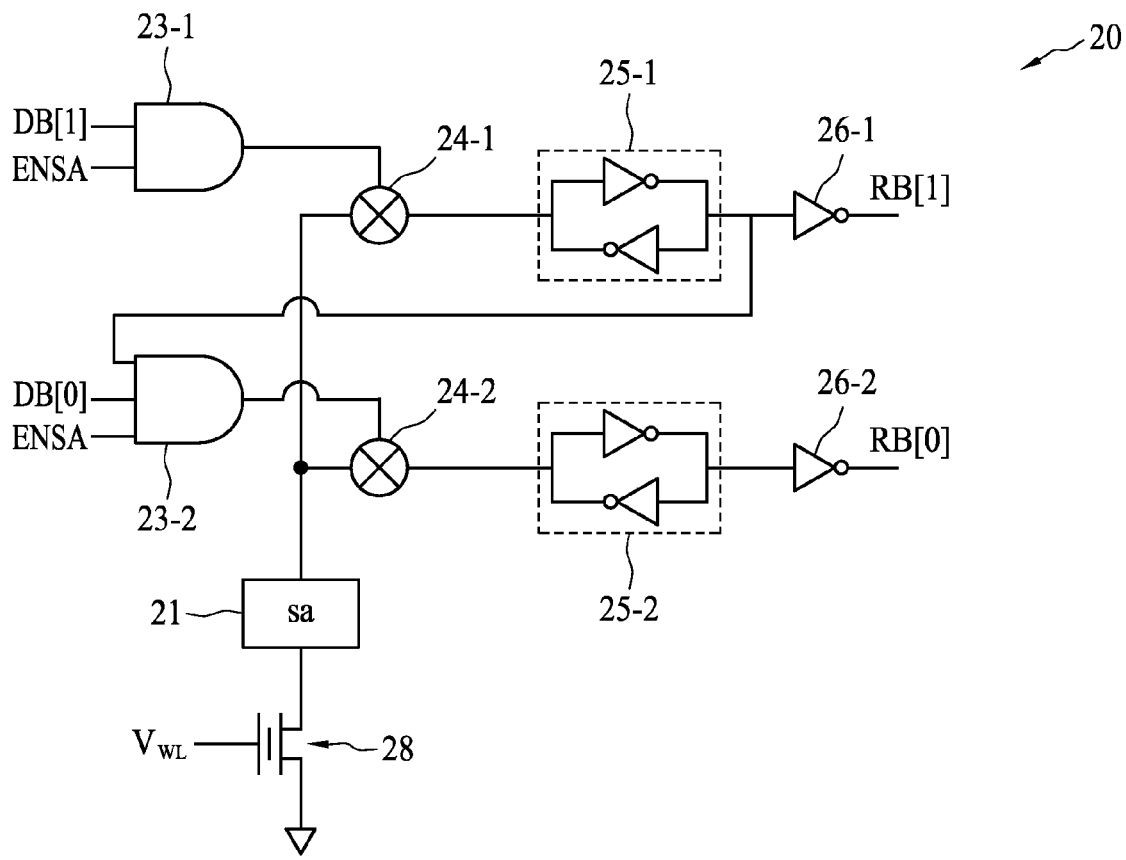
FIG. 2 is a circuit diagram of a circuit for sensing an MLC in accordance with one embodiment of the present invention.

FIG. 2 is a circuit diagram of a circuit 20 for sensing an MLC in accordance with one embodiment of the present invention. Referring to FIG. 2, the circuit 20 may include a sense amplifier 21, a first switch 24-1, a second switch 24-2, a first switch control unit 23-1 and a second switch control unit 23-2.

The sense amplifier 21 includes an output coupled to the first and second switches 24-1 and 24-2. Moreover, the sense amplifier 21 compares a threshold voltage of an MLC 28 with a sensing voltage V. The MLC 28, capable of storing more than one bit of information, has several possible states. In the present embodiment, the MLC 28 is able to store 2 bits of information and thus has four possible states. Accordingly, the sensing voltage $V_{WL}$ may have three different voltage levels for sensing the MLC 28 that stores one of four threshold voltages. In one embodiment, the sensing voltage $V_{WL}$ may be applied in order of voltage levels from low to high during a sensing period. As an example, assume that the MLC 28 has a second threshold voltage $V_{TH2}$. If a first sensing voltage $V_{WL1}$ is lower than the second threshold voltage $V_{TH2}$, a signal from the output of the sense amplifier 21 becomes "0". If, however, a subsequently applied second sensing voltage $V_{WL2}$ is greater than the second threshold voltage $V_{TH2}$, the signal from the output of the sense amplifier becomes "1".

Figure 1:
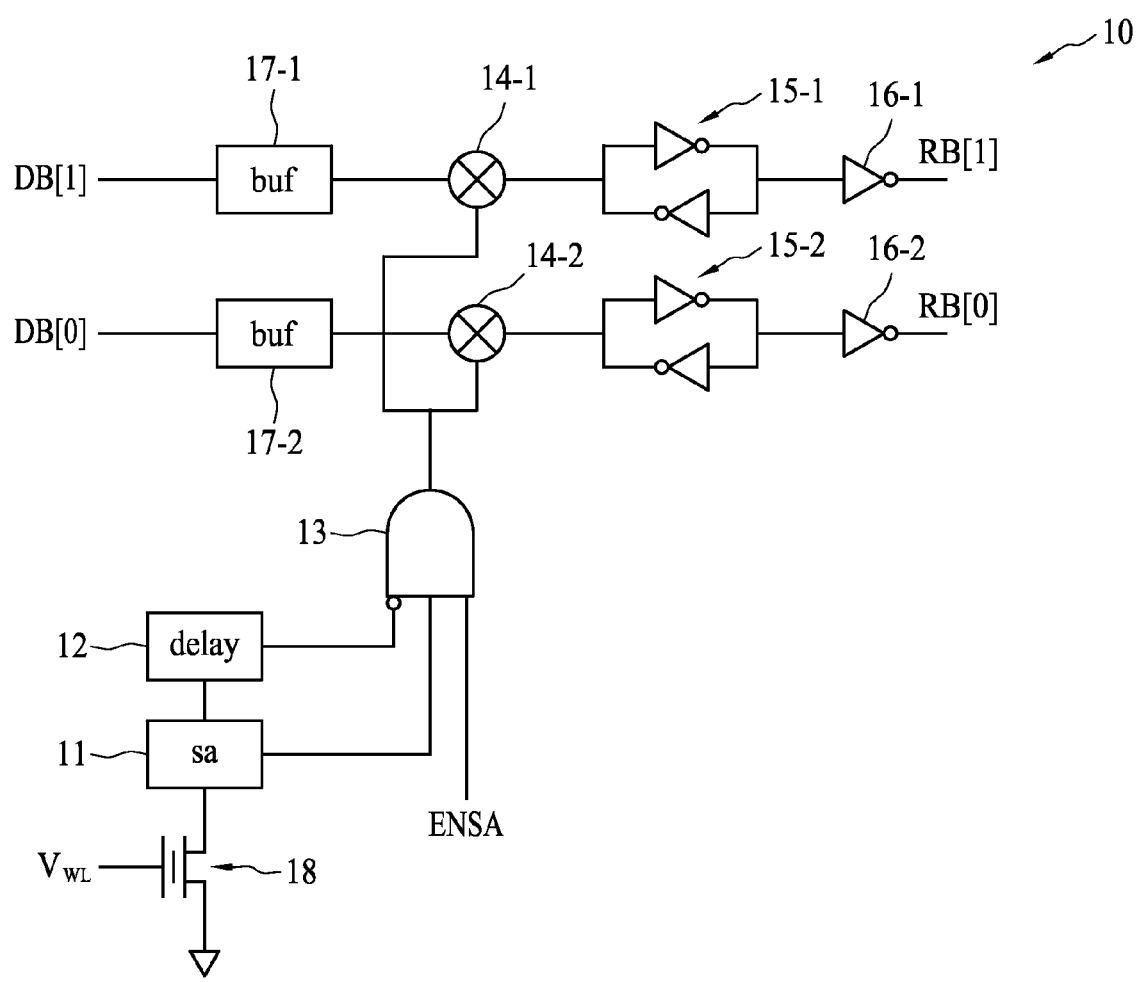
FIG. 1 is an exemplary circuit diagram of a sensing circuit for sensing a multi-level cell (MLC) in prior art.

The first switch control unit 23-1 may include but is not limited to, as shown in the present embodiment, an AND gate. Unlike the sensing circuit 10 illustrated in FIG. 1 in which the switches 14-1 and 14-2 are controlled by the sense amplifier 11, in the circuit 20 according to the embodiment of the present invention, the first switch control unit 23-1 is coupled to the first switch 24-1 and controls the on/off state of the first switch 24-1.

Likewise, the second switch control unit 23-2 may include but is not limited to, as shown in the present embodiment, an AND gate. The second switch control unit 23-2 is coupled to the second switch 24-2 and controls the on/off state of the second switch 24-2.

The circuit 20 may further include a first latch unit 25-1 and a second latch unit 25-2. The first latch unit 25-1 includes an input coupled to the first switch 24-1, and an output coupled to a first inverter 26-1. Likewise, the second latch unit 25-2 includes an input coupled to the second switch 24-2 and an output coupled to a second inverter 26-2. Furthermore, each of the first latch unit 25-1 and the second latch unit 25-2 includes two inverters each having an output coupled to the other's input. Moreover, the output of the first latch unit 25-1 is coupled to an input of the second switch control unit 23-2.

The output of the first inverter 26-1 is a first read bit RB[1], and the output of the second inverter 26-2 is a second read bit RB[0]. In one embodiment, the read bits RB[1] and RB[0] are default as logic 0.

The first switch control unit 23-1 outputs a first signal to control the first switch 24-1 in response to a first data bit DB[1] from a counter (not shown). Specifically, the first switch control unit 23-1 outputs a logic-high first signal in response to a logic-high first data bit DB[1], which turns on the first switch 24-1, and outputs a logic-low first signal in response to a logic-low first data bit DB[1], which turns off the first switch 24-1.

The second switch control unit 23-2 outputs a second signal to control the second switch 24-2 in response to a second data bit DB[0] from the counter and an output signal from the first latch unit 25-1. Specifically, the second switch control unit 23-2 outputs a logic-high second signal in response to a logic-high second data bit DB[0] and a logic-high output signal from the first latch unit 25-1, which turns on the second switch 24-2, and outputs a logic-low second signal in response to a logic-low second data bit DB[0] or a logic-low output signal from the first latch unit 25-1, which turns off the second switch 24-2.

The first data bit DB[1] and the second data bit DB[0] represent the state of a 2-bit counter. For example, if the 2-bit counter is in a state of "10", then the first data bit DB[1] represents the most significant bit, "1" and the second data bit DB[0] represents the second most significant bit, in the present case also the least significant bit, "0".

In operation, during a sensing period, signal "ENSA" is kept at a high logic level, i.e., logic 1. When a first sensing voltage $V_{WL1}$ of a first level such as "11" is served, the sense amplifier 21 outputs a signal of logic 1 to the first and second switches 24-1 and 24-2 if the MLC 28 has a first threshold voltage, which represents a 2-bit information of "11". Meanwhile, if the data bits from the 2-bit counter are "11", i.e., the first data bit DB[1] is "1" and the second data bit DB[0] is "1", the first switch control unit 23-1 outputs a logic-high signal and turns on the first switch 24-1 in response to the logic-high first data bit DB[1]. The value "1" from the sense amplifier 21 is read via the first latch unit 25-1 and the first inverter 26-1, overwriting the first read bit RB[1] as "1".

However, the value "1" from the sense amplifier 21 is not overwritten until a latch latency period of the first latch unit 25-1 is over. During the latch latency period, the output at the first latch unit 25-1 is kept at "1" before the first inverter 26-1 in view of the default value "0" of the first read bit RB[1]. Accordingly, the second switch control unit 23-2 outputs a logic-high signal and turns on the second switch 24-2 in response to the logic-high second data bit DB[0] and the logic-high output at the first latch unit 25-1 during the latch latency period. Subsequently, the value "1" from the sense amplifier 21 is read via the second latch unit 25-2 and the second inverter 26-2, overwriting the second read bit RB[0] as "1". As a result, the information stored in the MLC 28, "11," is read.

If the MLC 28 stores other information than "11," the sense amplifier 21 outputs a logic-low signal "0" and the read bits RB[1] and RB[0] are maintained as their default values.

Next, when a second sensing voltage $V_{WL2}$ of a second level such as "10" is served, the sense amplifier 21 outputs a signal of logic 1 to the first and second switches 24-1 and 24-2 if the MLC 28 has a second threshold voltage, which represents a 2-bit information of "10". Meanwhile, if the data bits from the 2-bit counter are "10", i.e., the first data bit DB[1] is "1" and the second data bit DB[0] is "0", the first switch control unit 23-1 outputs a logic-high signal and turns on the first switch 24-1 in response to the logic-high first data bit DB[1]. The value "1" from the sense amplifier 21 is read via the first latch unit 25-1 and the first inverter 26-1, overwriting the first read bit RB[1] as "1".

The second switch control unit 23-2 outputs a logic-low signal and turns off the second switch 24-2 in response to the logic-low second data bit DB[0]. Accordingly, the second read bit RB[0] is maintained as its default value "0". As a result, the information stored in the MLC 28, "10," is read.

Similarly, if the MLC 28 stores other information than "10," the sense amplifier 21 outputs a logic-low signal "0" and the read bits RB[1] and RB[0] are maintained as their default values.

Next, when a third sensing voltage $V_{WL3}$ of a third level such as "01" is served, the sense amplifier 21 outputs a signal of logic 1 to the first and second switches 24-1 and 24-2 if the MLC 28 has a third threshold voltage, which represents a 2-bit information of "01". Meanwhile, if the data bits from the 2-bit counter are "01", i.e., the first data bit DB[1] is "0" and the second data bit DB[0] is "1", the first switch control unit 23-1 outputs a logic-low signal and turns off the first switch 24-1 in response to the logic-low first data bit DB[1]. Accordingly, the first read bit RB[1] is maintained as its default value "0".

The second switch control unit 23-2 outputs a logic-high signal and turns on the second switch 24-2 in response to the logic-high second data bit DB[0] and the logic-high output at the first latch unit 25-1 during the latch latency period. The value "1" from the sense amplifier 21 is read via the second latch unit 25-2 and the second inverter 26-2, overwriting the second read bit RB[0] as "1". As a result, the information stored in the MLC 28, "01," is read.

Similarly, if the MLC 28 stores other information than "01," the sense amplifier 21 outputs a logic-low signal "0" and the read bits RB[1] and RB[0] are maintained as their default values.

Furthermore, the information stored in the MLC 28 is identified as "00" if it is not read in the above-mentioned detecting process when the sensing voltages $V_{WL1}$, $V_{WL2}$ and $V_{WL3}$ are served.

Figure 3:
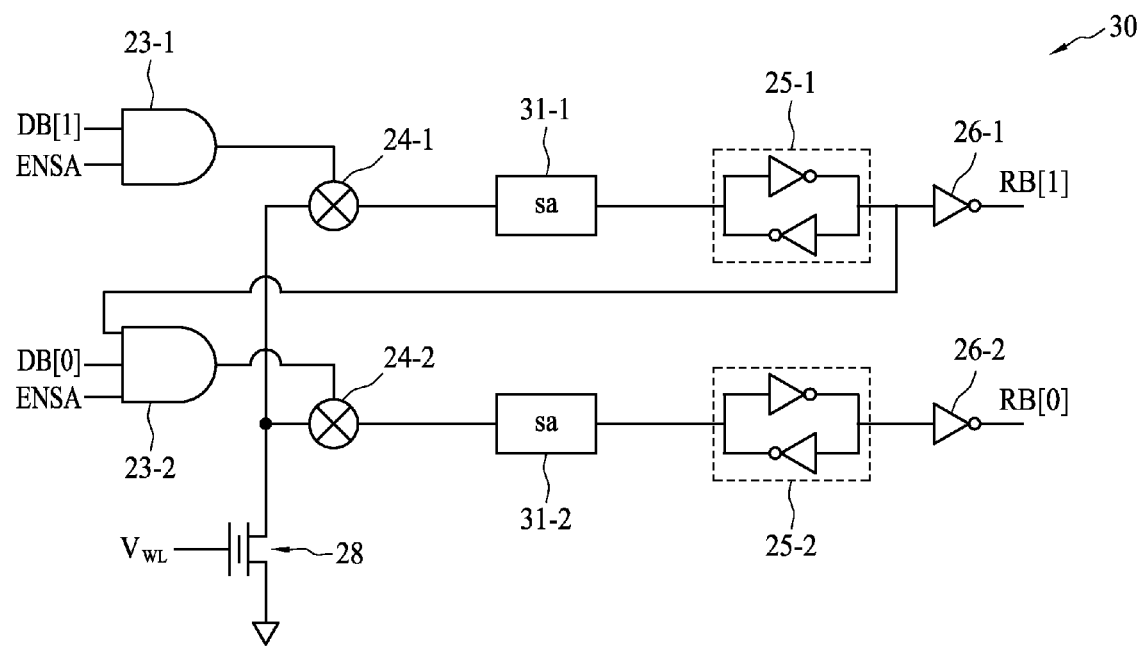
FIG. 3 is a circuit diagram of a circuit for sensing an MLC in accordance with another embodiment of the present invention.

FIG. 3 is a schematic circuit diagram of a circuit 30 for sensing an MLC in accordance with another embodiment of the present invention. Referring to FIG. 3, the circuit 30 may be similar to the circuit 20 illustrated in FIG. 2 except that, for example, a first sense amplifier 31-1 and a second sense amplifier 31-2 replace the signal sense amplifier 21. Specifically, the first sense amplifier 31-1 is disposed between the first switch 24-1 and the first latch unit 25-1, while the second sense amplifier 31-2 is disposed between the second switch 24-1 and the second latch unit 25-2.

In operation, if the data bits from the 2-bit counter are "11", as previously discussed, the first and second switches 24-1 and 24-2 are turned on. Meanwhile, when a first sensing voltage $V_{WL1}$ of a first level "11" is served, the first sense amplifier 31-1 outputs a logic-high signal to overwrite the first read bit RB[1], and second sense amplifier 31-2 outputs a logic-high signal to overwrite the second read bit RB[0]. As a result, the information stored in the MLC 28, "11," is read.

Next, if the data bits from the 2-bit counter are "10", the first switch 24-1 is turned on while the second switch 24-2 is turned off. When a second sensing voltage $V_{WL2}$ of a second level "10" is served, the first sense amplifier 31-1 outputs a logic-high signal to overwrite the first read bit RB[1], and second sense amplifier 31-2 is blocked because the second switch 24-2 is turned off. The second read bit RB[0] is maintained as its default value, "0". As a result, the information stored in the MLC 28, "10," is read.

Next, if the data bits from the 2-bit counter are "01", the first switch 24-1 is turned off while the second switch 24-2 is turned on. When a third sensing voltage $V_{WL3}$ of a third level "01" is served, the first sense amplifier 31-1 is blocked because the first switch 24-1 is turned off, and the second switch 24-2 outputs a logic-high signal to overwrite the second read bit RB[0]. The first read bit RB[1] is maintained as its default value, "0". As a result, the information stored in the MLC 28, "01," is read.

The above-described embodiments of the present invention are intended to be illustrative only. Numerous alternative embodiments may be devised by persons skilled in the art without departing from the scope of the following claims.

What is claimed is:

1. A circuit for sensing a multi-level cell (MLC), comprising:
   a first switch associated with a first read bit;
   a second switch associated with a second read bit;
   a first switch control unit to control the first switch in response to a first data bit from a counter; and
   a second switch control unit to control the second switch in response to a second data bit from the counter.

2. The circuit of claim 1, wherein each of the first switch control unit and the second switch control unit includes a logic AND gate.

3. The circuit of claim 1, wherein the first data bit represents the most significant bit of the counter and the second data bit represents the second most significant bit of the counter.

4. The circuit of claim 1 further comprising a sense amplifier having an output coupled to the first switch and the second switch.

5. The circuit of claim 4, wherein an output of the sense amplifier is allowed to overwrite the first read bit in response to the first data bit, and allowed to overwrite the second read bit in response to the second data bit.

6. The circuit of claim 1 further comprising:
   a first latch unit including an input coupled with the first switch and an output coupled to an input of the second switch control unit; and
   a second latch unit including an input coupled with the second switch.

7. The circuit of claim 6 further comprising a first sense amplifier coupled between the first switch and the first latch unit, and a second sense amplifier coupled between the second switch and the second latch unit.

8. The circuit of claim 7, wherein an output of the first sense amplifier is allowed to overwrite the first read bit in response to the first data bit, and an output of the second sense amplifier is allowed to overwrite the second read bit in response to the second data bit.

9. The circuit of claim 6 further comprising a first inverter coupled to the first latch unit and a second inverter coupled to the second latch unit.

10. A circuit for sensing a multi-level cell (MLC), comprising:
    a first switch associated with a first read bit;
    a first sense amplifier coupled to the first switch; and
    a first switch control unit to control the first switch so as to allow an output from the first sense amplifier to overwrite the first read bit in response to a first data bit from a counter.

11. The circuit of claim 10 further comprising:
    a second switch associated with a second read bit; and
    a second switch control unit to control the second switch in response to a second data bit from the counter.

12. The circuit of claim 11, wherein the first sense amplifier includes an output coupled to the first switch and the second switch.

13. The circuit of claim 11 further comprising:
    a first latch unit including an input coupled with the first switch and an output coupled to an input of the second switch control unit; and
    a second latch unit including an input coupled with the second switch.

14. The circuit of claim 13, wherein the first sense amplifier is coupled between the first switch and the first latch unit.

15. The circuit of claim 13 further comprising a second sense amplifier coupled between the second switch and the second latch unit.

16. The circuit of claim 13 further comprising a first inverter coupled to the first latch unit and a second inverter coupled to the second latch unit.

17. The circuit of claim 11, wherein each of the first switch control unit and the second switch control unit includes a logic AND gate.

18. The circuit of claim 11, wherein the first data bit represents the most significant bit of the counter and the second data bit represents the second most significant bit of the counter.

* * * * *